US010266943B2

(12) United States Patent
Khaja et al.

(10) Patent No.: US 10,266,943 B2
(45) Date of Patent: Apr. 23, 2019

(54) PLASMA CORROSION RESISTIVE HEATER FOR HIGH TEMPERATURE PROCESSING

(71) Applicant: Applied Materials, Inc., Santa Clara, CA (US)

(72) Inventors: Abdul Aziz Khaja, San Jose, CA (US); Ren-Guan Duan, Fremont, CA (US); Amit Kumar Bansal, Sunnyvale, CA (US); Jianhua Zhou, Campbell, CA (US); Juan Carlos Rocha-Alvarez, San Carlos, CA (US)

(73) Assignee: Applied Materials, Inc., Santa Clara, CA (US)

(*) Notice: Subject to any disclaimer, the term of this patent is extended or adjusted under 35 U.S.C. 154(b) by 1276 days.

(21) Appl. No.: 14/464,180

(22) Filed: Aug. 20, 2014

(65) Prior Publication Data
US 2015/0376780 A1   Dec. 31, 2015

Related U.S. Application Data

(60) Provisional application No. 62/018,057, filed on Jun. 27, 2014.

(51) Int. Cl.
*C23C 16/44* (2006.01)
*H01L 21/67* (2006.01)
(Continued)

(52) U.S. Cl.
CPC ...... *C23C 16/4405* (2013.01); *C23C 16/4581* (2013.01); *H01L 21/67103* (2013.01); *H01L 21/68757* (2013.01); *H01L 21/68792* (2013.01)

(58) Field of Classification Search
CPC ............ C23C 16/4405; C23C 16/4581; H01L 21/67103; H01L 21/68757; H01L 21/68792
(Continued)

(56) References Cited

U.S. PATENT DOCUMENTS 6,066,836 A * 5/2000 Chen .................. C23C 16/46
118/725
6,070,552 A * 6/2000 Mizuno ............... C23C 16/4412
118/723 E
(Continued)

FOREIGN PATENT DOCUMENTS

CN    101026119 A    8/2007
CN    101101887 A    1/2008
(Continued)

OTHER PUBLICATIONS

Office Action from Chinese Patent Application No. 201510358900.8 dated Aug. 1, 2018.
(Continued)

*Primary Examiner* — Dana Ross
*Assistant Examiner* — Joseph W Iskra
(74) *Attorney, Agent, or Firm* — Patterson + Sheridan, LLP (57) ABSTRACT

Implementations described herein protect a substrate support from corrosive cleaning gases used at high temperatures. In one embodiment, a substrate support has a shaft and a heater. The heater has a body. The body has a top surface, a side surface and a bottom surface. The top surface is configured to support a substrate during plasma processing of the substrate. A covering is provided for at least two of the top surface, side surface and bottom surface. The covering is selected to resist corrosion of the body at temperatures in excess of about 400 degrees Celsius.

10 Claims, 6 Drawing Sheets

(51) Int. Cl.
*C23C 16/458* (2006.01)
*H01L 21/687* (2006.01)

(58) Field of Classification Search
USPC ........ 219/548; 428/610, 615, 632, 633, 654,
428/650, 651, 652, 653, 640, 639, 332,
428/334, 335, 336, 472.2, 469, 660,
428/472.1; 422/129, 241; 119/50, 715
See application file for complete search history.

(56) References Cited

U.S. PATENT DOCUMENTS

| | | | | |
|---|---|---|---|---|
| 8,067,067 | B2* | 11/2011 | Sun | C23C 16/4404 |
| | | | | 118/715 |
| 2008/0006204 | A1* | 1/2008 | Rusinko | C23C 16/4581 |
| | | | | 118/715 |
| 2008/0016684 | A1* | 1/2008 | Olechnowicz | H01L 21/67103 |
| | | | | 29/748 |

FOREIGN PATENT DOCUMENTS

| | | |
|---|---|---|
| CN | 101118865 A | 2/2008 |
| CN | 103436836 A | 12/2013 |

OTHER PUBLICATIONS

Office Action from Taiwan Patent Application No. 104120778 dated Aug. 21, 2018.

\* cited by examiner

PLASMA CORROSION RESISTIVE HEATER FOR HIGH TEMPERATURE PROCESSING

CROSS-REFERENCE TO RELATED APPLICATIONS

This application claims benefit of U.S. Provisional Application Ser. No. 62/019,057, filed Jun. 27, 2014, of which is incorporated by reference in its entirety.

BACKGROUND

Field

Implementations described herein generally relate to semiconductor manufacturing and more particularly to a method and apparatus for protecting heaters from corrosion during high temperature processing.

Description of the Related Art

During the manufacture of semiconductor devices, a substrate may undergo many operations in a variety of processing chambers for the purpose of forming material layers and features suitable for an end use. For example, the substrate may undergo several depositions, annealing, and etching operations, among other operations. Device miniaturization has made small dimensions for device patterns formed in a film layer of the substrate more critical. Achieving the critical dimensions in the substrate starts with a film layer of good quality and having good adhesion to underlying film layers in the substrate.

Complete disassociation of the process gasses when forming plasma enhances the quality of films deposited on the substrate. Using high temperatures in excess of about 400 degrees Celsius provides more complete disassociation of the process gasses and also provides strong adhesion of the high quality film on the substrate. However, the high temperatures also increases the amount of material intended to be deposited the substrate to form on chamber components. Such stray depositions on chamber components (i.e., film) undesirably contribute to process contamination and process skew. Thus, to prevent process contamination and process skew, the high temperature process chamber may require periodic cleaning.

In-situ cleaning of the high temperature process chamber may be performed using cleaning agents to remove the film on the chamber components. During cleaning, the film is typically reacted into a gaseous state that, along with the cleaning agent, is pumped out the processing chamber. During the cleaning, or an etching process, using nitrogen fluoride ($NF_3$) under high temperature, aluminum (Al) chamber components react with $NF_3$ to form aluminum fluoride ($AlF_x$) resulting in an AlFx powder forming in the chamber from the corrosion of Al chamber components. This extends to other corrosive plasma based chemistry, such as chlorine (Cl).

Therefore, there is a need for an improved apparatus and method of protecting high temperature chamber components from corrosion.

SUMMARY

Implementations described herein protect a substrate support from corrosive cleaning gases used at high temperatures. In one embodiment, a substrate support has a shaft and a heater. The heater has a body. The body has a top surface, a side surface and a bottom surface. The top surface is configured to support a substrate during plasma processing of the substrate. A covering is provided for at least two of the top surface, side surface and bottom surface. The covering is selected to resist corrosion of the body at temperatures in excess of about 400 degrees Celsius.

In another embodiment, a processing reactor is provided. The processing reactor includes a high temperature processing reactor, having a chamber body having a lid, walls and bottom forming an interior volume, an inlet for allowing processing gas to enter the interior volume and form a plasma, and a substrate support. The substrate support has a shaft and a heater. The heater has a body. The body has a top surface, a side surface and a bottom surface. The top surface is configured to support a substrate during plasma processing of the substrate. A covering is provided for each of the top surface, side surface and bottom surface wherein the covering resists corrosion of the body at an elevated temperature.

In yet another embodiment, a method for cleaning a high temperature processing reactor is provided that includes introducing a cooling purge gas into a sleeve surrounding a shaft of a substrate support, the purge gas flowing across a bottom of the substrate support, exposing the substrate support to a cleaning plasma; and maintaining the substrate support at a temperature exceeding 400 degrees Celsius after cleaning. A method for cleaning a high temperature processing reactor is provided that includes introducing a cooling purge gas into a sleeve surrounding a shaft of a substrate support, the purge gas flowing across a bottom of the substrate support, exposing the substrate support to a cleaning plasma; and maintaining the substrate support at a temperature exceeding 400 degrees Celsius after cleaning.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

An apparatus and a method are disclosed for protecting high temperature chamber components from corrosion. In the present disclosure, "high temperature" is defined as a temperature exceeding about 400 degrees Celsius. A substrate support is provided with a coating to protect the substrate support surfaces at high temperatures from the corrosive gases. The coating may be in the form of at least one plasma spray coating, cover plate, edge ring or purge gas, which protect the heater and shaft of the substrate support and significantly mitigate the formation of contaminate byproducts resulting from attack by processing gases at high temperatures.

Figure 1:
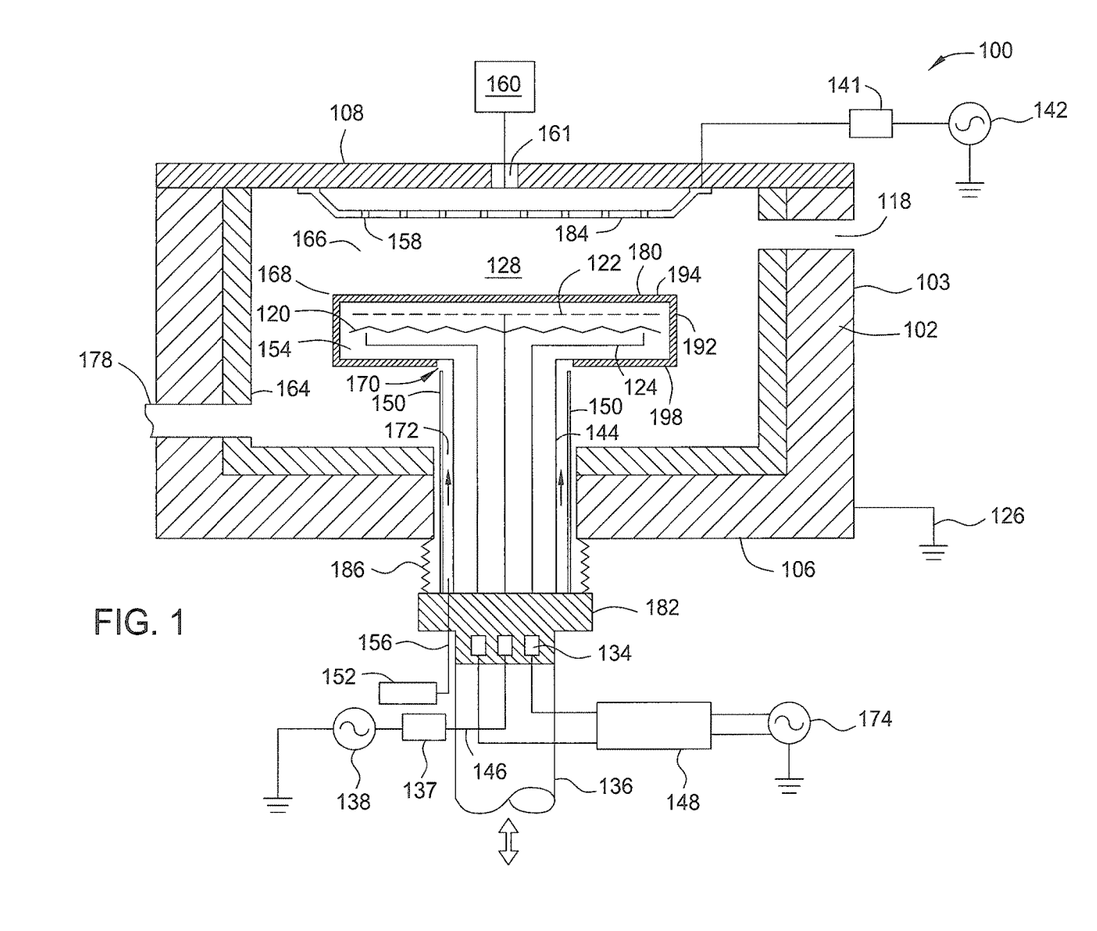
FIG. 1 is a cross-sectional schematic side view of a high temperature processing reactor.

FIG. 1 is a cross-sectional schematic view of an exemplary high temperature processing reactor 100 having a heater 120 for supporting a substrate during processing. In one implementation, the high temperature processing reactor 100 is configured as deposition reactor. Although shown in the processing reactor 100 illustrated in FIG. 1, the heater 120 may be utilized in other processing reactors, for example plasma treatment chambers, physical vapor deposition chambers, chemical vapor deposition chambers, and ion implantation chambers, among other reactors having a heater that may be subject to high temperatures.

The high temperature processing reactor 100 includes a grounded chamber body 102. The chamber body 102 includes walls 103, a bottom 106 and a lid 108 which enclose an internal chamber volume 128. The chamber body 102 is coupled to a ground 126. A protective liner 164 is disposed in the internal chamber volume 128 to protect the walls 103 of the high temperature processing reactor 100. The protective liner 164 and walls 103 having an opening 118 through which a substrate (not shown) may be robotically transferred into and out of the internal chamber volume 128.

A pumping port 178 is formed in one of the walls 103 or the bottom 106 of the chamber body 102. The pumping port 178 fluidly connects the internal chamber volume 128 to a pumping system (not shown). The pumping system may include one or more pumps and throttle valves. The pumping system is utilized to maintain a vacuum environment within the internal chamber volume 128 of the high temperature processing reactor 100, while removing processing byproducts. The pumping system and chamber thermal design enables high base vacuum (about $1 \times E^{-8}$ Torr or less) and low rate-of-rise (about 1,000 mTorr/min) at temperatures suited to thermal budget needs, e.g., about −25 degrees Celsius to about +500 degrees Celsius. In one embodiment, the pumping device enables a vacuum pressure between 10 and 30 mT.

A gas source 160 is coupled to the processing reactor 100 and provides process gases into the internal chamber volume 128 through an inlet 161 formed through the chamber body 105 or lid 108. In one or more embodiments, process gases may include halogen-containing gases, such as fluorine (Fl) gas and/or chlorine (Cl) gas. Alternately, the process gasses may include deposition gasses such as, for example, gases that include carbon (C), silicon (Si), oxygen (O), nitrogen (N), combinations thereof or other suitable gases. The gas source 160 also provides cleaning gases utilized to clean components present in or exposed to the internal chamber volume 128 of the processing reactor 100. Examples of cleaning gases which may be provided by the gas source 160 include halogen-containing gases, such as a fluorine gas, a fluorine-containing gas, a chlorine gas and/or a chlorine-containing gas.

A showerhead 184 may be coupled to the lid 108 of the high temperature processing reactor 100. The showerhead 184 has a plurality of gas delivery holes 158 for distributing process gases entering through the inlet 161 into the internal chamber volume 128. The showerhead 184 may be connected to an RF power source 142 through a match circuit 141. The RF power provided by the RF power source 142 to the showerhead 184 energizes the process gases exiting the showerhead 184 for maintaining plasma between the showerhead 184 and heater 120 within the internal chamber volume 128.

A substrate support assembly 144 is disposed in the internal chamber volume 128. The substrate support assembly 144 includes the heater 120 on which the substrate is supported during processing. The heater 120 may comprise a dielectric body 154. The dielectric body 145 may be formed from a ceramic material, aluminum nitride (AlN), yttria alumina garnet (YAG), or other suitable material. The dielectric body 154 may optionally have an aluminum core coated with a dielectric material.

A cathode electrode 122 is embedding within the dielectric body 154 of the heater 120 and connected to an RF power source 138 through an integrated match circuit 137. The cathode electrode 122 capacitively couples power to the plasma from below the substrate on the heater 120. In one embodiment, the RF power source 138 provides the cathode electrode 122 with between about 200 W to about 1000 W of RF power. The RF power source 138 may also be coupled to a system controller (not shown) for controlling the operation of the cathode electrode 122 by directing a DC current to the cathode electrode 122 for chucking and de-chucking the substrate.

The heater 120 may include one or more resistive heaters 124 embedded in the dielectric body 154. The resistive heaters 124 are coupled through an RF filter 148 to a heater power source 174. The resistive heaters 124 may be provided to elevate the temperature of the heater 120, and substrate disposed thereon, to a temperature for conducting substrate processing.

The substrate support assembly 144 may also include a shaft 136. A top end of the shaft 136 is couple to the body 154 of the heater 120, while a bottom end of the shaft 136 is coupled to a thermal isolator 182. The shaft 136 may be formed from a ceramic material, aluminum nitride (AlN), yttria alumina garnet (YAG), or other suitable material. The thermal isolator 182 may have cooling channels 134 to prevent heat from the heater 120 from conducting down through the shaft 136 to components outside of the processing reactor 100, thereby allowing better temperature control of the substrate support assembly 144. Channels may be formed through the thermal isolator 182 for routing conductors to the resistive heaters 124 and the cathode electrode 122.

The substrate support assembly 144 may be movably coupled to the chamber body 102. The substrate support assembly 144 may be movable between an upper position 166 and a lower position 168. A bellow 186 may provide a seal between the thermal isolator 182, or other portions of the substrate support assembly 144, and the chamber body 102. The bellow 186 provides a vacuum seal and prevents the process gasses from leaving the internal chamber volume 128.

A sleeve 150 may be sealingly attached to the thermal isolator 182 outward of the shaft 136. The sleeve 150 circumscribes the shaft 136 and may extend up along the shaft 136 toward the heater 120, leaving a gap 170 between the sleeve 150 and the heater 120 and the shaft 136. A purge gas line 156 may pass through the thermal isolator 182. The purge gas line 156 may connect a gas generator 152 to a space 172 formed between the sleeve 150 and the shaft 136. The purge gas flowing into the space 172 flows towards the heater 120, exiting the space 172 through the gap 170. The purge gas provides a thermal barrier between the sleeve 150 and shaft 136, thus thermally isolating the substrate support assembly 144 from the gases within the internal chamber volume 128. Additionally, the purge gas may prevent process gases from entering into the space 172 between the sleeve 150 and the shaft.

The heater 120 may have a top cover 190. The top cover 190 may be the form of a plate or coating. The heater 120 may also have an edge ring 194. The edge ring 194 may be in the form of a plate or coating. Additionally, the heater may have a side cover 192. The side cover 192 a plate or coating. The heater 120 may also have a bottom cover 198. The bottom cover 198 may be in the form of a plate or coating. One or more of the top cover 190, edge ring 194, side cover 192 and bottom cover 198 may be utilized to protect the heater 120 from the corrosive environment within the internal chamber volume 128 of the high temperature processing reactor 100. One or more of the top cover 190, edge ring 194, side cover 192 and bottom cover 198 (collectively referred to as the "covering") may be in the form of a coating having a thickness of about 1 mils to about 20 mils, such as about 8 mils. The covering may comprise coating materials such as an aluminum silicon magnesium yttrium oxygen compound (AsMy), $Y_4Al_2O_9$ compound and $Y_{2-x}Zr_xO_3$ solid solution mixed material (HPM), zirconium dioxide ($ZrO_2$), yttria ($Y_2O_3$), erbium oxide ($Er_2O_3$) or other material suitable to protect the substrate support assembly when exposed to halogen-containing gases at temperature in excess of 400 degrees Celsius. The covering material may be applied by spraying, dipping, electrostatic powder coated, or applied in another suitable method to the heater 120 and/or shaft 136. In one embodiment, the covering is a coating of 99.9 percent pure AsMy having a thickness of about 8 mils with a porosity of about 0.25 percent to 4.0 percent and a surface roughness of about 150 µ-in. The covering material may further be thermally treated to a temperature between about 650 degrees Celsius and about 1,100 degree Celsius for improving adhesion strength to the underlying layer, i.e., the heater 120 and/or the shaft 136. The thermal treatment may last for up to 10 hrs to obtain good adhesion of the coating material. In one embodiment, the covering is heated for about 1 hour at about 750 degrees Celsius to obtain an adhesion strength to an AlN substrate of about 16 MPa.

In one embodiment, a nitrogen trifluoride $NF_3$ cleaning gas is introduced into the high temperature processing reactor 100 to form a plasma for processing in the internal chamber volume 128. The temperature of the top surface of the heater 120 is maintained at a temperature exceeding about 400 degrees Celsius. The top cover 190, edge ring 194, side cover 192 and bottom cover 198 protect the AlN in the heater 120 from reacting with the corrosive $NF_3$ gas and forming $AlF_x$, which could later form a contaminant.

The AlFx, aluminum chloride ($AlCl_x$), or other byproduct may form on the heater 120 and the shaft 136 in the presence of corrosive processing gases at temperatures higher than about 400 degrees Celsius. Different solutions are provided herein which protect the heater 120 and shaft 136 from the corrosive processing gases at the high temperature. In one embodiment, the heater 120 is protected from the corrosive processing gases at the high temperature by the covering and the purge gas passing between the shaft and sleeve. In another embodiment, the heater is protected from the corrosive processing gases at the high temperature by the covering present on at least the bottom and sidewall of the heater. FIGS. 2 through 5 illustrate various embodiments for protecting the heater 120 and shaft 136 from the corrosive processing gases at the high temperature.

Figure 2:
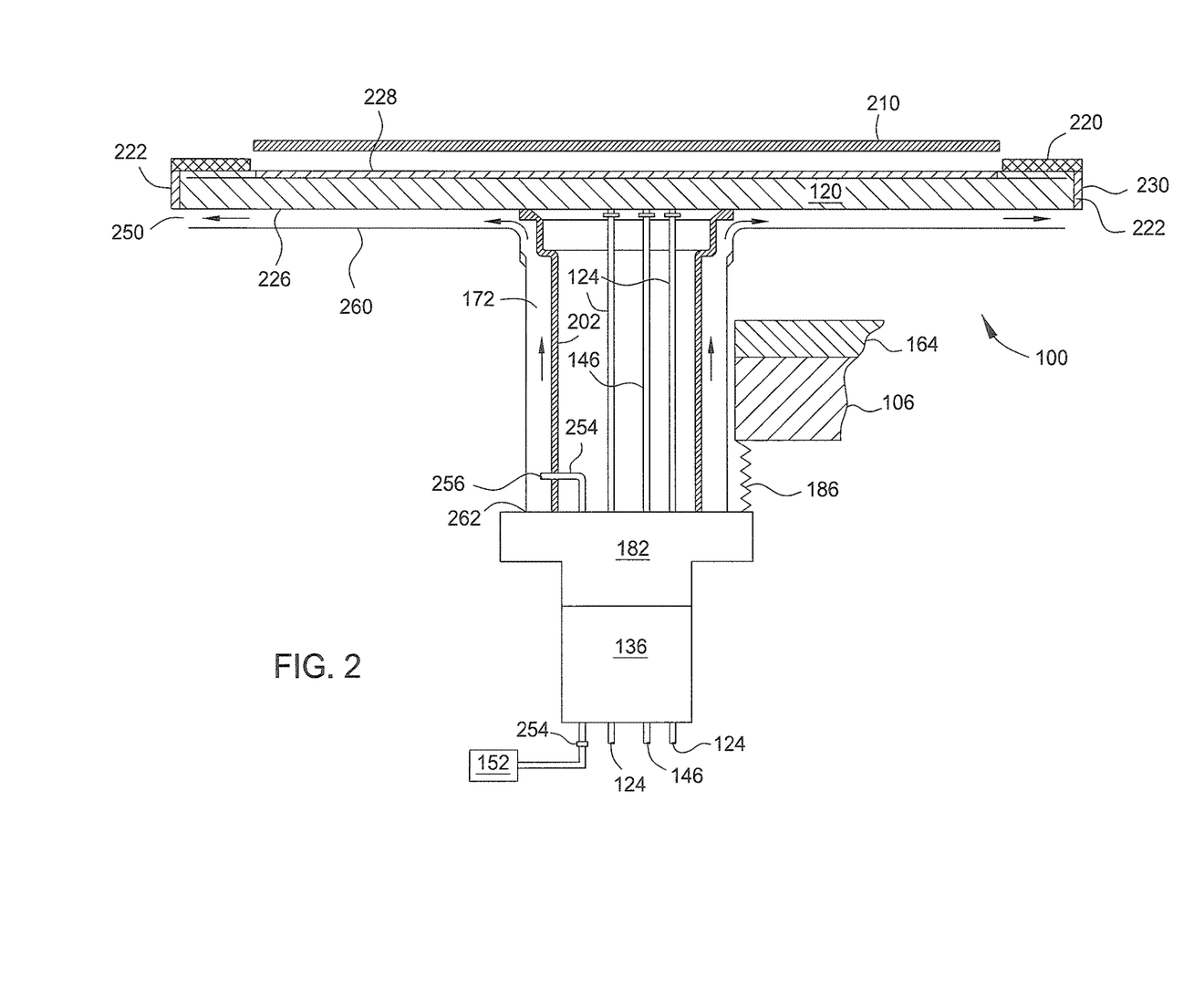
FIG. 2 illustrates a heater having a sleeve along with a gas purge for use in the high temperature processing reactor.

FIG. 2 illustrates a substrate support assembly 200 having a sleeve 260 for directing a gas purge for use in the high temperature processing reactor, such as the processing reactor 100 shown in FIG. 1. A small portion of the bottom 106 and the protective liner 164 of the high temperature processing reactor is shown with the support assembly 200 protruding therethrough.

The sleeve 260 is sealingly attached, outward of the shaft 136, at a location 262 on the thermal isolator 182. The sleeve 260 may be attached to the thermal isolator 182 by welding, gluing, riveting, or with any other suitable method. The sleeve 260 is not in direct contact with either the shaft 136 or the heater 120 of the substrate support assembly 200. The space 172 is defined between the sleeve 260 and at least one of the shaft 136 and the heater 120. Since the thermal isolator 182 is fixed to the substrate support assembly 200, the sleeve 260 moves in conjunction with the movement of the substrate support assembly 200.

A purge gas is introduced into the space 172 between the sleeve 260 and at least one of the shaft 136 and the heater 120. The purge gas may flow from the gas generator 152, through a purge gas line 254 and out a wall 202 of the shaft 136, or directly into the space 172 through the thermal isolator 182. The purge gas exits the space 172 through an opening 250 defined between an outer edge 222 of the heater 120 and the sleeve 260. The purge gas may be a cooling gas for thermally isolating the sleeve 260 from the shaft 136 and heater 120. The purge gas may also prevent process gases from flowing into the space 172. The purge gas flowing through the space 172 prevents heat from the heater 120, which may be maintained at temperatures in excess of 400 degrees Celsius, from heating the sleeve 260 to a temperature similar to that of the support assembly 200. In this manner, the sleeve 260 not only isolates the shaft 136 and the bottom 226 of the heater 120 of the substrate support assembly 200 from contacting the corrosive processing and/or cleaning gas while at high temperatures, but also prevents the sleeve 260 from reaching temperatures of about 400 degree Celsius. Thus, the sleeve 260 remains much cooler than 400 degree Celsius, and thus, inhibits the formation of $AlF_x$ on the sleeve 260. Thus, the surfaces, i.e., the bottom 226 and shaft 136, remain isolated from the corrosive gases, and remain free from attack and byproducts formation, thus increasing the service life of the substrate support assembly 200.

The outer edge 222 of the heater 120 may have a side cover 230 and an edge ring 220. The edge ring 320 covers the area outside of the substrate supporting region defined on the top surface 228 of the heater 120. The side cover 230 and edge ring 220 may be formed from AlN plates coated with a coating material, such as AsMy or other material resistive to a corrosive plasma environmental elevated temperatures. In one embodiment, the AlN plates forming the side cover 230 and edge ring 220 are coated with an 8 mil thickness of AsMy. The AsMy coating may be about 99.9 percent pure, have a porosity of about 0.25 percent to 1.0 percent, and a surface roughness of about 150 µ-in. Alternately, the side cover 230 and edge ring 220 may be formed from bulk material, for example, AsMy or other material resistive to the corrosive plasma. In yet another alternative, the side cover 230 and edge ring 220 may be coated with coating material, for example, AsMy among others. The side cover 230 and edge ring 220 protect the outer edge 222 of the heater 120 from exposure to the corrosive plasma.

A top surface 228 of the heater 120 can be protected in the center (i.e., substrate supporting region) using a removable cover plate 210, or alternately a coating. During a cleaning process, the removable cover plate 210 may be placed on the top surface 228 with the substrate removed to protect the top surface of the heater 120 from the corrosive plasma. The removable cover plate 210 may be formed from material, such as bulk AsMy among others, or alternatively made from AlN and coated with a coating material, such as AsMy or other material which is resistive to corrosive plasma at elevated temperatures.

In one embodiment, the substrate support assembly 200 in the high temperature processing reactor is at about 400 degrees Celsius or more. The removable cover plate 210 is placed on a top surface of the heater 120 having the side cover 230 and the edge ring 220. A purge gas floods the space 172 to isolate the sleeve 260, which is exposed to the process and cleaning gases, from the heater 120 and shaft 136, thus maintaining the sleeve 260 to a temperature below 400 degrees Celsius and thereby preventing formation of contaminants such as $AlF_x$ on the sleeve 260, and also bottom of the heater 120 and shaft 136. Corrosive plasma containing fluorine ions is used in the chamber to clean the chamber components. The removable cover plate 210, the side cover 230, the edge ring 220 and the purge gas protect the heater 120 or shaft 136 from corrosion by the corrosive plasma, mitigating the formation of contaminants such as $AlF_x$.

Figure 3:
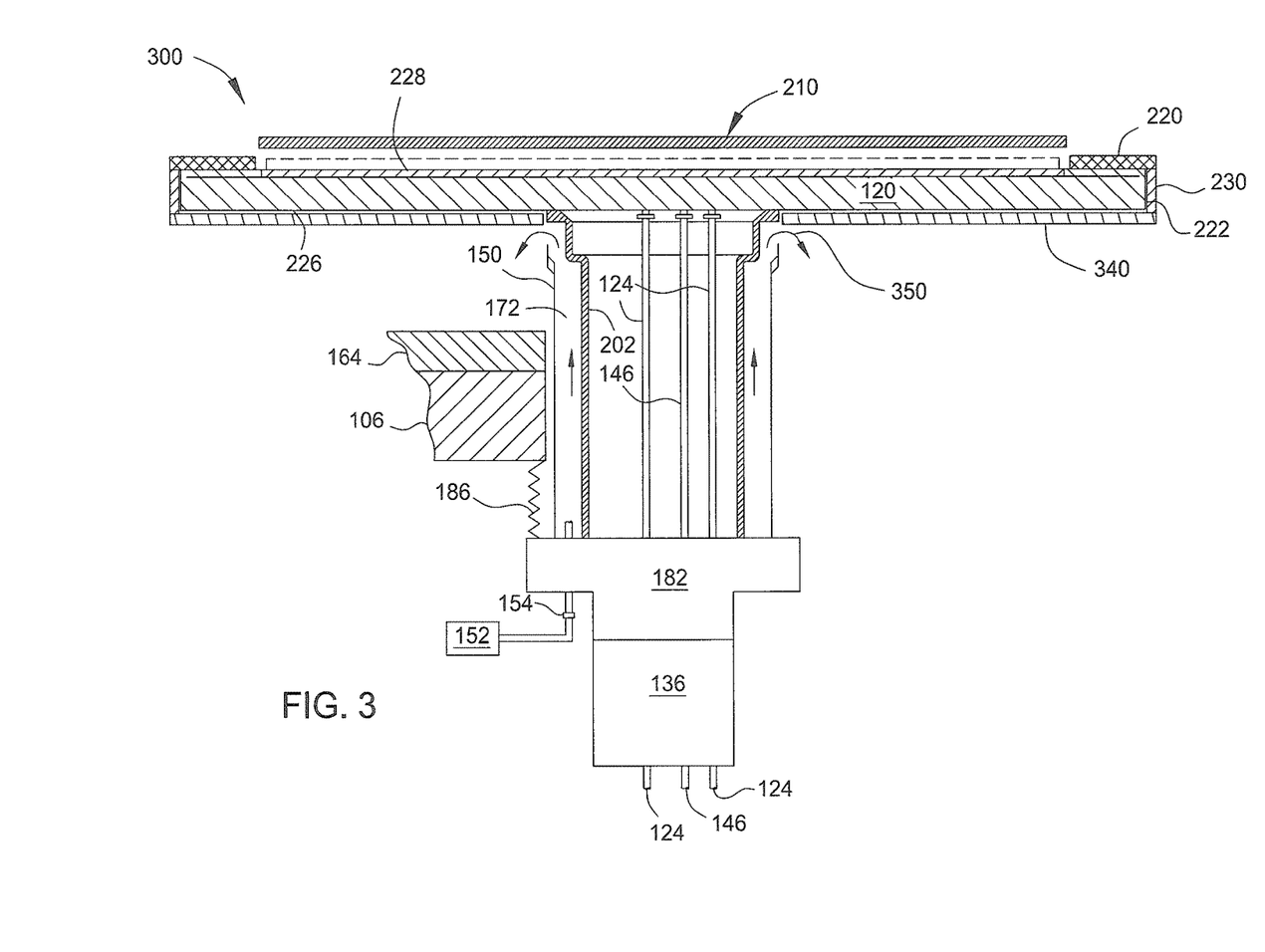
FIG. 3 illustrates another heater having a cover for use in the high temperature processing reactor.

FIG. 3 illustrates another substrate support assembly 300 having a covering for use in the high temperature processing reactor. A small portion of the bottom 106 and the protective liner 164 of the high temperature processing reactor is shown with the support assembly 300 protruding therethrough.

The heater 120 has a side cover 330, a bottom cover 340 and an edge ring 320. The side cover 430, the bottom cover 340 and the edge ring 320 may be formed with AlN plates coated with coating material, for example, AsMy, HPM, $Y_2O_3$, $Er_2O_3$, $ZrO_2$ or other suitable high temperature corrosion resistant material. The edge ring 320 (i.e., the area outside of the substrate region on the top surface 228 of the heater 120) may be covered with an AlN coated with coating material, for example AsMy among others, or fabricated from bulk material, such as AsMy or other material which is resistive to halogenated plasmas at elevated temperatures. Accordingly, the edge ring 320 protects the edge surfaces of the heater 120 from the corrosive plasma.

In one embodiment, the bottom 226 and the side 222 of the heater 120 is protectively covered with the edge ring 320, the side cover 330 and the bottom cover 340 made of AlN plates coated with coating material, such as AsMy among others, to protect the side 222 and the bottom 226 of the heater 120. In another embodiment, one or more of the side cover 430, the edge ring 320 and the bottom cover 340 is coated with coating material, such as AsMy among others.

During the cleaning process, the removable cover plate 210 may be placed on the top surface 228 of the heater 120 to protect the top surface 228 of the heater 120 from the cleaning plasma. The removable cover plate 210 may be an AlN plate coated with coating material, such as AsMy or other corrosive resistant material, and configured to fit inside the edge ring 320 to protect the top surface 228 of the heater 120 while cleaning. The removable cover plate 210 may be placed on the substrate support assembly 300, touching or few mils above the top surface 228 of the heater 120 during the cleaning process. The removable cover plate 210 may be preheated prior to placing on the top surface 228 to reduce the temperature delta and avoid thermal shock to the removable cover plate 210 and to ensure proper fit within the edge ring 320.

A bottom purge protects the shaft 136 of the substrate support assembly 300. The sleeve 150 is sealingly attached to thermal isolator 182 as similarly shown in FIG. 2. The sleeve 150 may be attached to thermal isolator 182 by welding, gluing, riveting, or with any other suitable method. The sleeve 150 is not in direct contact with the shaft 136 of the substrate support assembly 300, and does not extend along the bottom of the heater 120. Since the thermal isolator is fixed to shaft 136 of the substrate support assembly 300, the sleeve 260 additionally moves between an up position and a down position in conjunction with the movement of the substrate support assembly 300.

A purge gas is introduced into the space 172 between the sleeve 260 and the shaft 136 from the gas generator 152. A purge gas line 254, extending through the thermal isolator 182, provides purge gas from the generator 152 through the purge gas line 156 into the space 172. An opening 350 between bottom cover 340 of the heater 120 and the sleeve 150 allows the purge gas to exit the space 172 and flow into the internal chamber volume, from where the purge gas is eventually pumped out of the chamber. The purge gas may be a cooling gas for thermally isolating the shaft 136 from the sleeve 150. The purge gas may also prevent process gases from flowing into the space 172. The purge gas flowing through the space 172 prevents heat from the heater 120, which may be maintained at temperatures in excess of 400 degrees Celsius, from heating the sleeve 260 to a temperature similar to that of the support assembly 200. The heat is removed from the shaft 136 by conduction and convection with the purge gas and is moved away from the substrate support assembly 300 through opening 350. In this manner, the sleeve 150 protects the shaft 136 in the substrate support assembly 300 from achieving high temperatures, such as temperatures above about 400 degree Celsius. In this manner, the sleeve 260 not only isolates the shaft 136 and the bottom 226 of the heater 120 of the substrate support assembly 200 from contacting the corrosive processing and/or cleaning gas while at high temperatures, but also prevents the sleeve 260 from reaching temperatures of about 400 degree Celsius. Thus, the sleeve 260 remains much cooler than 400 degree Celsius, and thus, inhibits the formation of $AlF_x$ on the sleeve 260. Thus, the surfaces, i.e., the bottom 226 and shaft 136, remain isolated from the corrosive gases, and remain free from attack and byproducts formation, thus increasing the service life of the substrate support assembly 300.

Along with the bottom purge, it should be appreciated that any of the edge ring 320, the side cover 330 and the bottom cover 340 may be comprised of plates or a coating of material, such as AsMy among others. In one example, the edge ring 320 is a plate comprised or coated with AsMy, while the side cover 330 and the bottom cover 340 are coated with AsMy. In another example, the side cover 330 and the edge ring 320 are plates comprised or coated with AsMy, while the bottom cover 340 is coated with AsMy. In yet another example, the side cover 330, the edge ring 320 and the bottom cover 340 are all plates comprised or coated with AsMy. In yet another embodiment, the side cover 330, the edge ring 320 and the bottom cover 340 are all coated with AsMy. Any combination of plates comprised or coated with AsMy and component coated with AsMy may be utilized for protecting the heater 120, while a bottom purge gas running between the sleeve 150 and the shaft 136 may be utilized for substantially preventing $AlF_x$ or other byproducts from forming on either the sleeve 150 or the shaft 136.

Figure 4:
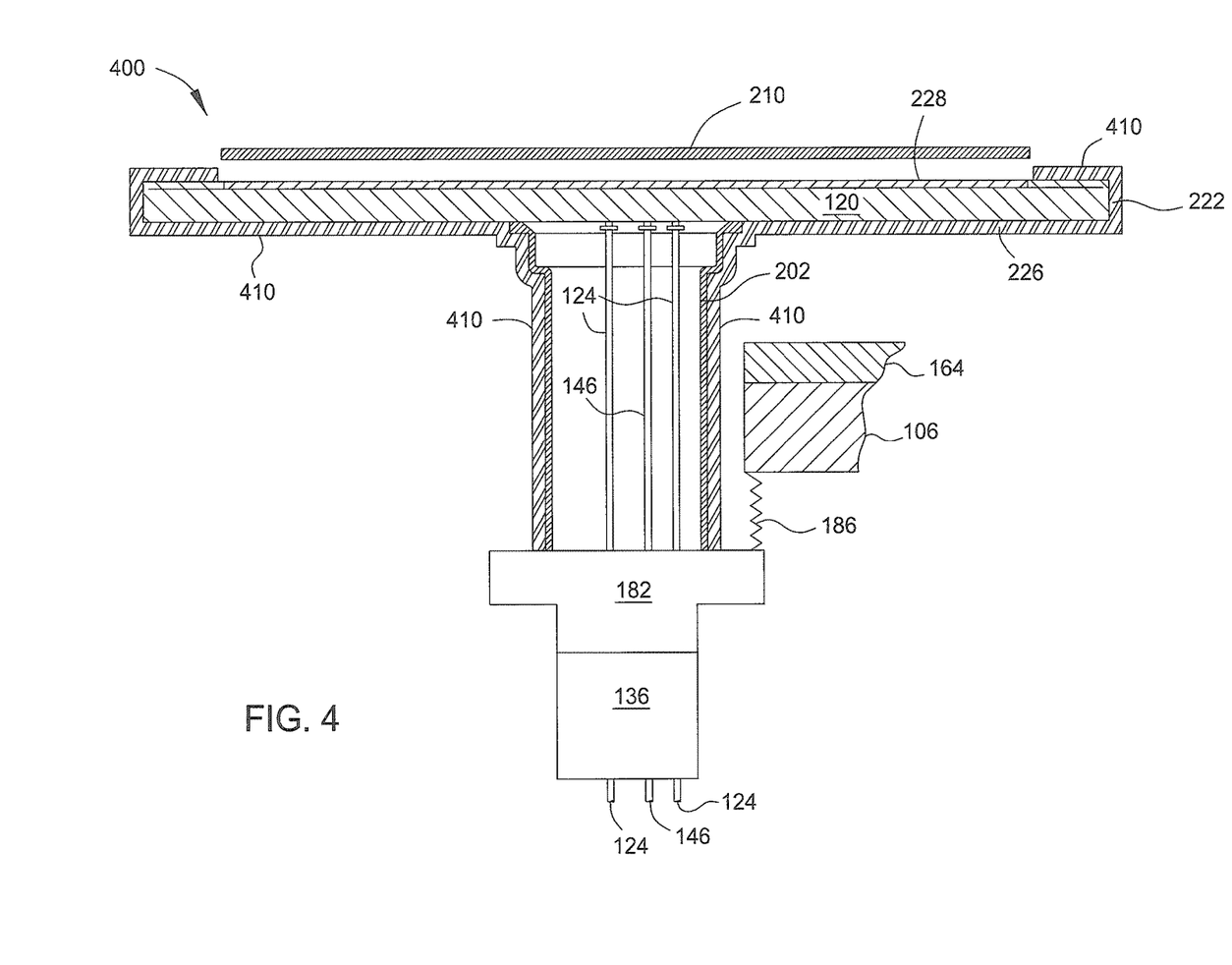
FIG. 4 illustrates yet another heater having a cover in the form of a coating for use in the high temperature processing reactor.

FIG. 4 illustrates yet another heater 120 having a covering for use in a high temperature processing reactor. The substrate support 400 may be similarly configured to substrate support assembly 300 shown in FIG. 3, without the bottom purge gas passing inside of a sleeve 150.

The substrate support 400 may be comprised of the AlN and have a coating 410. The coating 410 may be comprised of a material, such as AsMy among others. The coating 410 is resistant to the corrosive effects of the fluorine or chlorine plasma even at temperatures exceeding 500 degrees Celsius. The coating 410 may cover entirely over the substrate support 400, i.e. heater 120 and shaft 136.

The top surface 228 may be protected with the removable cover plate 210 or a coating, such as coating 410 on the substrate support 400. During the clean process, the removable cover plate 210 may be placed on the top surface 228 of the heater 120 to protect the top surface 228 of the heater 120 from fluorine, chlorine, or other corrosive plasma. The removable cover plate 210 may be an AlN plate coated with coating material, such as AsMy or other corrosive resistant material, and configured to fit inside the edge ring 320 to protect the top surface 228 of the heater 120 while cleaning. Alternately, the top surface 228 of the heater 120 may have a protective coating, such as AsMy, resistive to corrosive plasma. Thus, the protective coating makes the removable cover plate 210 unnecessary to protect the top surface 228 of the heater 120 while the chamber undergoes cleaning. Thereby after deposition and during a cleaning process occurring at temperatures above about 500 degrees Celsius, the coating 410 may protect the substrate support 400 and significantly reduce the formation of $AlF_x$. Apart from the coating 410 consisting of AsMy, any similar plasma based coating can be used to protect the substrate support 400.

Figure 5:
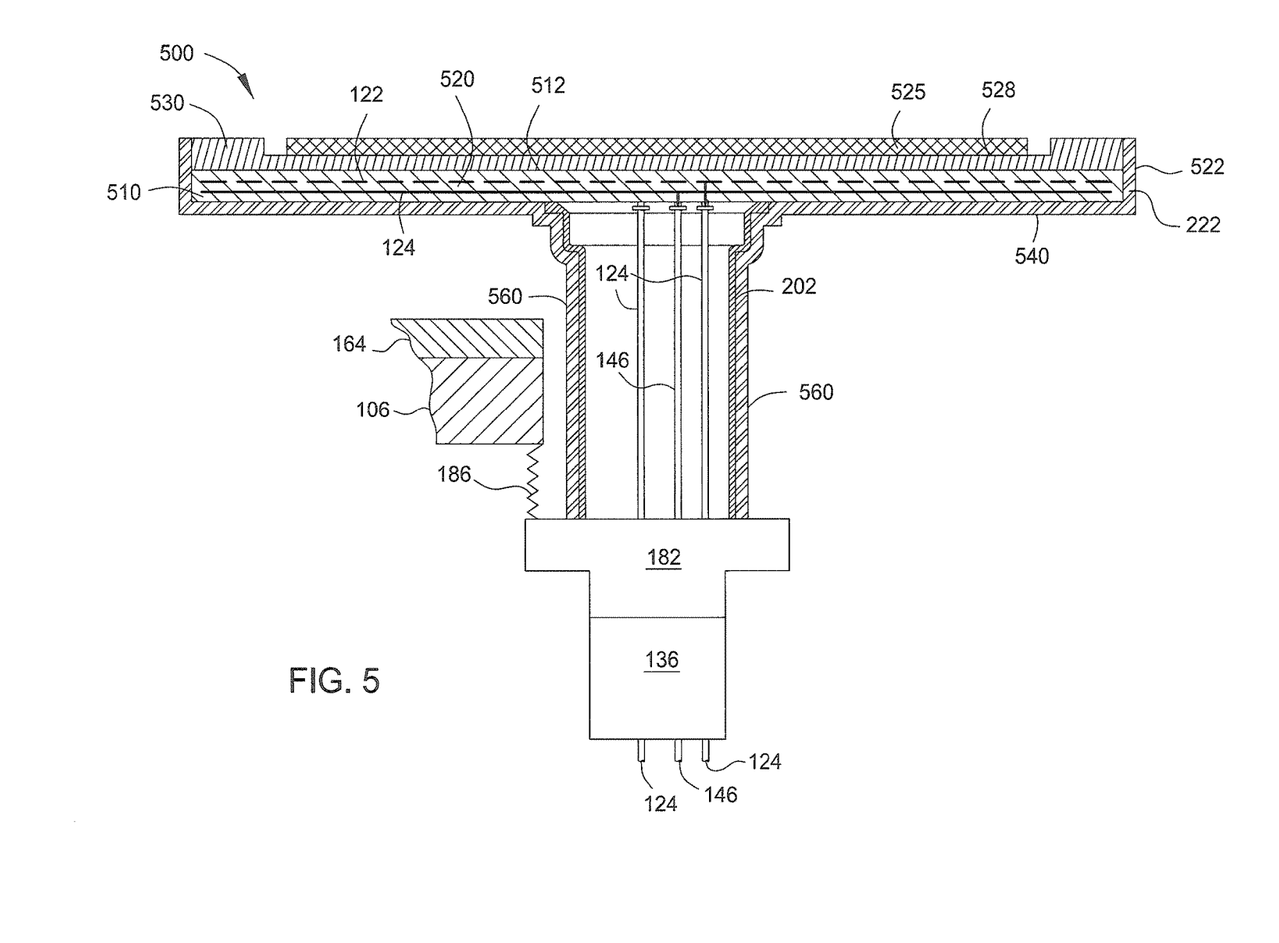
FIG. 5 illustrates yet another heater having a hybrid solution for preventing plasma attack.

FIG. 5 illustrates yet another heater having a hybrid solution for corrosive plasma used in the high temperature processing reactors. The hybrid substrate support 500 has a heater 520 and a shaft 136. The heater 520 includes an upper layer 530 and a lower layer 510. The cathode electrode 122 and resistive heaters 124 may be formed in the lower layer 510. Alternately, the electrode 122 and resistive heaters 124 may be formed in the upper layer 530.

The heater 520 may be made resistive to corrosion from fluorine or chlorine based plasma, even at temperatures exceeding 400 degrees Celsius. The lower layer 510 may be formed from AlN, yttrium aluminium garnet, or other suitable material. The upper layer 530 may be formed from a highly corrosion resistive material, such as a bulk material comprised of AsMy, magnesium oxide doped AlN, or other suitable material. The upper layer 530 may be disposed upon an AlN surface 512 of the lower layer 510. A substrate 525 may be supported on a top surface 528 of the upper layer 530.

The upper layer 530 and the lower layer 510 may be bonded together. For example, the upper layer 530 and lower layer 510 may be molded, cold isostatic pressing (CIP), hot press sintered, diffused bonded, glued, or adhered to each other in any suitable method. Thus, the heater 520 may be formed from a hybrid material (upper layer 530 and lower layer 510) which has high corrosion resistance to fluorine plasma at elevated temperatures, i.e., above about 400 degrees Celsius, on the AlN surface 512.

The lower layer 510 may be sandwiched between the corrosive material covering of the upper layer 530 along with a bottom cover 540 and a side cover 522. The bottom cover 540 and the side cover 522 may be a plate or coating as discussed above. For example, the bottom cover 540 and the side cover 522 may be a corrosion resistive coating such as AsMy. Alternatively, the bottom cover 540 and the side cover 522 may be a corrosion resistive plate, such as an AlN plate covered in AsMy, a bulk AsMy, or other suitable material. The bottom cover 540 and the side cover 522 may protect the outer edge 222 and bottom 226 of the heater 520 from corrosion due to the corrosive plasma at high temperatures.

The wall 202 of the shaft 136 for the hybrid substrate support 500 may have a cover 560. The cover 560 protects the shaft 136 from erosion due to the corrosive plasma at high temperatures, i.e., fluorine based plasma at temperatures exceeding about 400 degrees Celsius, such as about 500 degrees Celsius. The cover 560 may be a plate or coating as discussed above. Alternatively, the hybrid substrate support 500 may incorporate a bottom purge as shown in FIG. 2 or FIG. 3.

Figure 6:
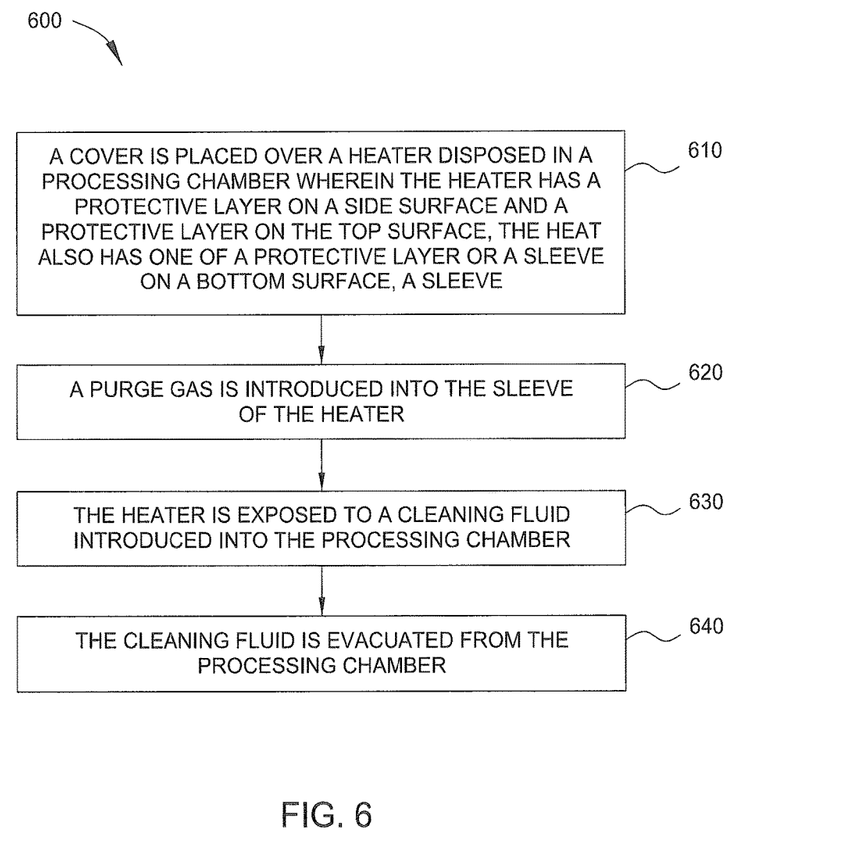
FIG. 6 is a flow diagram for a method for protecting a heater from corrosion during high temperature processing.

FIG. 6 is a flow diagram for a method for protecting a heater from corrosion in a high temperature processing reactor. Beginning at step 610, a movable cover is placed over a heater disposed on a substrate support in a processing chamber. The removable cover plate may be an AlN plate having a protective coating, bulk AsMy or other suitable corrosion resistant material. Alternately, the upper surface of the heater may have a protective coating, such as AsMy.

The heater has a protective layer on a side surface, and a protective layer on the top surface. The bottom surface may have a protective layer or use a cooling purge gas confined against the bottom by a sleeve extended extending from a thermal isolator. The thermal isolator may be attached to a shaft supporting the heater. The sleeve may also protect the shaft with the cooling purge gas. Alternately, the shaft may have a protective layer similar to that found on the heater. The protective layer may be coating material, such as AsMy, or protective plates, such as AlN plates having the protective coating or bulk AsMy.

At step 620, a purge gas is introduced into the sleeve. The purge gas is confined between the sleeve and the heater and/or shaft. The purge gas flows past the heater and/or shaft to remove heat from them and prevent a surface temperature of the heater and shaft adjacent to the cooling purge gas from exceeding 400 degrees Celsius.

At step 630, the heater is exposed to corrosive cleaning plasma introduced into the high temperature processing reactor. The high temperature processing reactor may be at a temperature exceeding 400 degrees Celsius, such as 500 degrees Celsius. The cleaning fluid may comprise fluorine or chlorine based plasma. The fluorine or chlorine based plasma may corrode unprotected Al at temperatures greater than about 400 degrees Celsius to form $AlF_x$ or other byproducts. The heater and the shaft are protected from corrosion by the fluorine or chlorine based plasma by either cooling or protective coating. Thus, the corrosive cleaning plasma does not react with the heater In step 640, the cleaning fluids along with the byproducts formed in the high temperature processing reactor are evacuated from the cleaned chamber. Advantageously, the heater and the shaft of substrate support may remain at a high temperature while cleaning and not experience aggressive corrosion and byproduct formation in the chamber which may affect processing of subsequent substrates therein.

In one embodiment, the method and apparatus described above related to carbon film deposition at high temperatures, i.e., greater than 400 degrees Celsius, such as 500 degrees Celsius. After deposition of the carbon film and during a chamber cleaning process using nitrogen trifluoride ($NF_3$) in the high chamber temperature, the aluminum nitride (AlN) chamber components are protected by a coating and purge gas from reacting with the corrosive $NF_3$ and forming aluminum fluoride ($AlF_x$). The $AlF_x$ formation is significantly reduced by a coating solution applied to the chamber components, such as the AlN heater and the AlN shaft of the substrate support mitigating particle formation, i.e. contamination, in the chamber.

While the foregoing is directed to implementations of the present invention, other and further implementations of the invention may be devised without departing from the basic scope thereof, and the scope thereof is determined by the claims that follow.

We claim:

1. A substrate support, comprising:
    a shaft;
    a heater, the heater comprising:
        a body having a top surface, a side surface and a bottom surface extending inward from the side surface to the shaft, the top surface configured to support a substrate thereon during plasma processing; and
        a covering provided for at least two of the top surface, the side surface and the bottom surface, wherein the covering is selected to resist corrosion of the body at temperatures in excess of about 400 degrees Celsius; and
    a sleeve circumscribing the shaft, the sleeve and the shaft forming a space therebetween adapted to flow a purge gas therethrough in a direction toward the body, wherein the sleeve further comprises:
        a gap formed between the sleeve and the bottom surface of the heater, wherein the purge gas flowing into the space flows towards the heater and exits the space through the gap; and
        a portion extending away from the shaft along the bottom surface of the body, the space defined between the shaft and the sleeve continuing along the bottom surface of the body.

2. The substrate support of claim 1 wherein the covering is a coating of material selected from the group consisting of an aluminum silicon magnesium yttrium oxygen compound, $Y_4Al_2O_9$ compound and $Y_{2-x}Zr_xO_3$ solid solution mixed material (HPM), yttria ($Y_2O_3$), erbium oxide ($Er_2O_3$), and zirconium dioxide ($ZrO_2$).

3. The substrate support of claim 1 wherein the covering is a coating comprising aluminum silicon magnesium yttrium oxygen compound (AsMy).

4. The substrate support of claim 1, wherein the covering for the top surface comprises:
    an edge ring; and
    a removable cover plate.

5. The substrate support of claim 4, wherein the edge ring and the removable cover plate comprises bulk AsMy.

6. The substrate support of claim 4, wherein the edge ring and the removable cover plate are formed from AlN coated with AsMy.

7. The substrate support of claim 3, wherein the AsMy coating is about 8 mil thick.

8. The substrate support claim 6, wherein the AsMy coating is heat treated.

9. A substrate support, comprising:
    a shaft;
    a heater, the heater comprising:
        a body having a top surface, a side surface and a bottom surface extending inward from the side surface to the shaft, the top surface configured to support a substrate thereon during plasma processing; and
        a covering provided for at least two of the top surface, the side surface and the bottom surface, wherein the covering is selected to resist corrosion of the body at temperatures in excess of about 400 degrees Celsius;
    a sleeve circumscribing the shaft, the sleeve and the shaft forming a space therebetween adapted to flow a purge gas therethrough in a direction toward the body;
    a thermal isolator coupled to a bottom of the shaft opposite the heater, wherein the sleeve is sealingly attached to the thermal isolator; and
    a second space formed between the sleeve and the bottom surface of the heater, wherein the second space is fluidly coupled to the first space and extends to an outer periphery of the heater, wherein the purge gas flowing into the space flows towards the heater, enters the second space flowing away from the shaft and exits the second space through an opening.

10. The substrate support of claim 9, wherein the sleeve is not in direct contact with either the shaft or the heater.

* * * * *

UNITED STATES PATENT AND TRADEMARK OFFICE
CERTIFICATE OF CORRECTION

PATENT NO. : 10,266,943 B2  
APPLICATION NO. : 14/464180  
DATED : April 23, 2019  
INVENTOR(S) : Abdul Aziz Khaja et al.

Page 1 of 1

It is certified that error appears in the above-identified patent and that said Letters Patent is hereby corrected as shown below:

In the Specification

In Column 1, Line 8, delete "62/019,057," and insert -- 62/018,057, --, therefor.

In Column 10, Line 51, delete "heater" and insert -- heater. --, therefor.

In the Claims

In Column 12, Line 13, in Claim 8, after "support" insert -- of --.

Signed and Sealed this  
Eighteenth Day of June, 2019

Andrei Iancu  
*Director of the United States Patent and Trademark Office*